(12) United States Patent
Anandan et al.

(10) Patent No.: US 11,482,671 B2
(45) Date of Patent: Oct. 25, 2022

(54) APPARATUS AND METHOD FOR DIRECT PATTERNING OF AN ORGANIC MATERIAL USING AN ELECTROSTATIC MASK

(71) Applicant: eMagin Corporation, Hopewell Junction, NY (US)

(72) Inventors: Munisamy Anandan, Austin, TX (US); Amalkumar P. Ghosh, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 136 days.

(21) Appl. No.: 17/021,306

(22) Filed: Sep. 15, 2020

(65) Prior Publication Data

US 2020/0411765 A1 Dec. 31, 2020

Related U.S. Application Data

(62) Division of application No. 15/968,128, filed on May 1, 2018, now Pat. No. 10,903,427.

(Continued)

(51) Int. Cl.
*H01L 51/00* (2006.01)
*C23C 14/04* (2006.01)
(Continued)

(52) U.S. Cl.
CPC ........ *H01L 51/0011* (2013.01); *C23C 14/042* (2013.01); *C23C 14/12* (2013.01);
(Continued)

(58) Field of Classification Search
CPC .... C23C 14/56–568; C23C 14/30–568; H01B 1/12–128; H01B 3/18–56;
(Continued)

(56) References Cited

U.S. PATENT DOCUMENTS 9,273,390 B2   3/2016   Shen et al.
2015/0240345 A1   8/2015   Shen et al.

OTHER PUBLICATIONS

Final Rejection dated Jun. 12, 2020 for U.S. Appl. No. 15/968,128.
(Continued)

*Primary Examiner* — Julio J Maldonado
*Assistant Examiner* — Stanetta D Isaac
(74) *Attorney, Agent, or Firm* — Kaplan Breyer Schwarz, LLP

(57) ABSTRACT

A deposition system that mitigates feathering in a directly deposited pattern of organic material is disclosed. Deposition systems in accordance with the present disclosure include an evaporation source, an electrically conductive shadow mask, and an electrically conductive field plate. The source imparts a negative charge on vaporized organic molecules as they are emitted toward a target substrate. The source and substrate are biased to produce an electric field having field lines that extend normally between them. The shadow mask and field plate are located between the source and substrate and each functions as an electrostatic lens that directs the charged vapor molecules toward propagation directions aligned with the field lines as the charged vapor molecules approach and pass through them. As a result, the charged vapor molecules pass through the shadow mask to the substrate along directions that are substantially normal to the substrate surface, thereby mitigating feathering in the deposited material pattern.

5 Claims, 6 Drawing Sheets

Related U.S. Application Data

(60) Provisional application No. 62/492,517, filed on May 1, 2017.

(51) Int. Cl.
  *C23C 14/24* (2006.01)
  *H01L 51/56* (2006.01)
  *C23C 14/12* (2006.01)
  *H01L 51/50* (2006.01)

(52) U.S. Cl.
  CPC ............ *C23C 14/24* (2013.01); *H01L 51/001* (2013.01); *H01L 51/56* (2013.01); *H01L 51/5012* (2013.01)

(58) Field of Classification Search
  CPC ............. H01L 21/312–3128; H01L 21/32056; H01L 51/0002–0013; H01L 51/0021–0023
  See application file for complete search history.

(56) References Cited

OTHER PUBLICATIONS

Fu-Ching Tung et al., "OLED Fabrication by Using a Novel Planar Evaporation Technique", http://dx/doi.org/10.1155/2014/683037, "International Journal of Photoenergy", dated Jun. 22, 2014, p. 8, vol. 2014, No. Article ID 683037, Publisher: Hindawi Publishing Corporation, Published in: TW.

Non-Final Office Action received for U.S. Appl. No. 15/968,128, dated Oct. 4, 2019, 10 pages.

Notice of Allowance and Fees Due (PTOL-85) dated Sep. 22, 2020 for U.S. Appl. No. 15/968,128.

Requirement for Restriction/Election received for U.S. Appl. No. 15/968,128, dated Jun. 26, 2019, 7 pages.

APPARATUS AND METHOD FOR DIRECT PATTERNING OF AN ORGANIC MATERIAL USING AN ELECTROSTATIC MASK

STATEMENT OF RELATED CASES

This application is a divisional application of U.S. patent application Ser. No. 15/968,128, entitled Apparatus and Method for Direct Patterning of an Organic Material Using an Electrostatic Mask, filed on May 1, 2018, which claims priority to U.S. Provisional Patent Application Ser. No. 62/492,517 filed on May 1, 2017, both of which are fully incorporated herein by reference.

TECHNICAL FIELD

The present disclosure relates to material deposition in general, and, more particularly, to direct patterning of a material layer on a substrate via deposition of the material onto the substrate through a shadow mask.

BACKGROUND

Semiconductor fabrication requires the formation of one or more patterned layers of material on the surface of a substrate. The most common approach for forming a material pattern is to deposit a full-surface layer of the material over the entire surface of the substrate and then remove the material everywhere except where it is desired. This is commonly referred to as "subtractive patterning."

Unwanted material is removed in a multi-step process in which a layer of photoresist is formed over the material layer and illuminated with a pattern of light that is based on the desired material pattern. After it has been exposed, the photoresist covering the unwanted material is dissolved in a strongly basic developer solution, which leaves behind a photoresist mask that covers the material to remain on the substrate. An etchant is then used to remove the exposed material, thus patterning the material pattern as desired. Afterward, the photoresist mask must be removed and the substrate must be thoroughly cleaned to ensure no residue of photoresist or etch product remains on any of its surfaces.

During a subtractive patterning process, everything on the substrate (i.e., any previously defined structures and materials, etc.) is exposed to harsh chemicals, including the photoresist developer solution, the etchant used to pattern the material layer, and the chemicals used to clean the substrate. Unfortunately, many materials, such as organic and biological materials, cannot survive exposure to one or more of these chemicals. As a result, subtractive patterning cannot be used for such "sensitive materials" or to pattern any material layer formed subsequent to deposition of a sensitive material on a substrate. For such operations, therefore, a direct patterning process must be used.

A direct patterning process forms a desired pattern of material as it is deposited, thereby avoiding the need for post-deposition treatments and the harsh chemicals they normally involve. One such direct-patterning process is shadow-mask deposition, which is analogous to stencil-based printing techniques, such as stencil painting, silk screen printing, and the like.

A shadow mask used in semiconductor fabrication often includes a thin layer of structural material having a pattern of apertures (i.e., openings) that matches the pattern desired for the deposited material. During shadow-mask deposition, vapor molecules of the material is generated such that they flow from a source toward the substrate surface. The vapor molecules can be generated via any of a variety of processes, such as thermal evaporation, sputtering, and the like. The shadow mask is positioned just in front of (but typically not in contact with) the substrate surface. When the flow of material reaches the shadow mask, the passage of material to the substrate is blocked everywhere except at the apertures. As a result, the material layer is directly patterned during its deposition on the substrate and no additional post-deposition processing is required.

Historically, shadow-mask deposition has been used in semiconductor fabrication to define patterns of relatively large (>50 micron) features, such as wire-bond pads, etc. A typical shadow mask used in such applications is a thin, patterned metal layer held in an annular frame. While the minimum feature size and minimum separation between apertures for such shadow masks is quite large (typically greater than several tens of microns), such shadow masks are perfectly suitable for defining large-feature-size, sparse patterns of material like wire-bond pad patterns.

More recently, it has become desirable to employ shadow-mask deposition in the formation of electronic devices based on organic materials, such as organic light-emitting diodes (OLED), active-matrix OLED displays, organic solar cells, biological-material-based sensors, and the like. In many cases, much higher resolution and pattern density is required than can be achieved with a conventional metal-based shadow mask. As a result, high-performance shadow masks based on thin dielectric or semiconductor layers have been developed that enable feature sizes and pattern densities that are less than or equal to ten microns.

Such high-performance shadow masks typically have a very thin (<1 micron) layer of structural material (e.g., silicon nitride, silicon, etc.) disposed on an annular frame formed from a semiconductor or glass handle substrate. The apertures are formed in the thin structural layer, after which the center portion of the handle substrate is removed, leaving the central region of the structural layer as a patterned edge-supported membrane.

Theoretically, during shadow-mask deposition, material deposits only on the surface of the substrate in those regions located directly behind the apertures. In practice, however, as the vapor of the material travels from the source to the shadow mask, many vapor molecules propagate along directions that are not perfectly normal to the shadow mask and substrate. As a result, some molecules continue to travel laterally after passing through the shadow mask such that the resultant patterned regions extend beyond the edges of the apertures. The magnitude of this lateral spreading of the features (referred to as "feathering") is a function of the separation distance between the substrate surface and the shadow mask, which is preferably very small—a few microns at most, as well as the orientation of the source relative to the center of the shadow mask.

While feathering is not a critical issue when forming large, widely spaced features (e.g., wire-bond pads, etc.), it can be highly problematic when forming small-feature, highly dense patterns. For example, feathering can result in electrical shorts between adjacent electrical components, color mixing between different pixels or sub-pixels in an OLED display, and the like. In fact, feathering has been a limiting factor for the minimum feature size and pattern density attainable using shadow-mask deposition.

To improve the fidelity between the shadow-mask pattern and the material pattern realized on a substrate, collimators have been developed in the prior art. A collimator is a relatively thick plate containing an arrangement of narrow through-holes. The through holes are designed to enable the passage of only vaporized atoms traveling along directions that are nearly normal to the surface of the substrate. As a result, the vaporized atoms that pass through the shadow mask apertures have little or no lateral component to their propagation direction and, therefore, feathering is reduced. Unfortunately, the inclusion of a collimator leads to material waste and longer process times. Furthermore, even with the use of collimation, the problem of feathering remains severe for deposition systems having long substrate-to-source distances.

The need for a practical direct-deposition approach suitable for defining high-resolution material layers remains, as yet, unmet in the prior art.

SUMMARY

The present disclosure presents apparatus and methods that enable direct patterning of an organic-material layer via evaporation through a shadow mask onto a target substrate without some of the costs and disadvantages of the prior art. Embodiments of the present invention mitigate feathering during shadow-mask deposition by imparting an electrostatic force on vaporized molecules traveling from an evaporation source to a target substrate, where the force directs the vapor molecules along propagation directions that are substantially normal to the substrate. As a result, the vapor molecules exhibit little or no lateral spread as they deposit on the substrate after passing through the apertures of the shadow mask.

An illustrative embodiment is a deposition system comprising a reaction chamber that encloses an evaporation source, a field plate, and a shadow mask, where the field plate and shadow mask are located between the source and substrate.

The evaporation source is configured to impart a negative charge on vapor molecules produced by the evaporation of organic source material during the evaporation process itself. The source is held at electrical ground, while a first voltage is applied to a segmented conductor disposed on the surface of the substrate. The first voltage potential produces a first electric field whose field lines are aligned with a vertical axis that is substantially normal to each of the source and substrate.

The field plate is a conductive plate having a coarse arrangement of openings that enable passage of the vapor molecules through the field plate. The field plate is positioned just in front of the source and held at a second voltage that is less than the first voltage. As a result, the field plate functions as a coarse electrostatic mask whose openings function as large electrostatic lenses that act to focus the negatively charged vapor molecules along directions more closely aligned with the vertical axis.

The shadow mask is an electrically conductive membrane having an arrangement of fine apertures suitable for forming a high-density pattern of fine features (≤10 microns) on the substrate. The shadow mask is positioned just in front of the substrate and held at a third voltage that is between the first and second voltages. As a result, the shadow mask functions as a fine electrostatic mask comprising a plurality of small electrostatic lenses that act to further focus the negatively charged vapor molecules along directions even more closely aligned with the vertical axis.

In operation, organic material is evaporated at the source, which imparts a negative charge on the resultant vapor molecules. As emitted from the source, the vapor molecules have a wide range of propagation directions. As the vapor molecules approach the field plate, however, their propagation paths are curved by the electrostatic lenses of the field plate openings such that they are more closely aligned with the field lines of the first electric field as they pass through the field plate and proceed toward the shadow mask.

As the vapor molecules approach the shadow mask, the apertures of the shadow mask function as a finer set of electrostatic lenses that further refine the propagation directions for the charged vapor molecules. As a result, those vapor molecules that pass through the apertures propagate substantially normally to the substrate surface. In other words, they have little or no lateral component to their propagation directions, which significantly reduces or eliminates feathering in the material pattern defined on the substrate surface.

An embodiment of the present invention is a deposition system operative for forming a plurality of features on a first surface of a substrate that includes a first conductor, wherein the plurality of features is arranged in a first arrangement, the deposition system comprising: a source for generating a plurality of vapor molecules of a first material, wherein the source is configured to impart a negative charge on each vapor molecule of the plurality thereof when it is generated; a shadow mask including a plurality of apertures that is arranged in the first arrangement, wherein the shadow mask is electrically conductive; and a voltage source that is configured to provide: a first voltage potential between the source and the first conductor; and a second voltage potential between the source and the shadow mask, wherein the second voltage potential is lower than the first voltage potential; and a vacuum chamber that is configured to contain the source, the shadow mask, and the substrate.

Another embodiment of the present invention is a deposition system operative for forming a plurality of features on a first surface of a substrate that includes a first conductor, wherein the plurality of features is arranged in a first arrangement, the deposition system comprising: a substrate chuck for locating the substrate such that the substrate defines a first axis that is normal to the first surface; a source for generating a first plurality of vapor molecules of a first organic material, each vapor molecule of the first plurality thereof being emitted from the source along a propagation direction having a propagation angle relative to the first axis, and wherein the source is configured to impart a negative charge on each vapor molecule of the first plurality thereof; a shadow mask including a plurality of apertures that is arranged in the first arrangement; a first plurality of electrostatic lenses, wherein a first electrostatic lens of the first plurality thereof is operative for altering the path of a first vapor molecule of a second plurality of vapor molecule such that the propagation angle of the first vapor molecule is reduced, wherein the first plurality of vapor molecule includes the second plurality of vapor molecule; and a vacuum chamber that contains the substrate chuck, the source, the shadow mask, and the first plurality of electrostatic lenses.

Yet another embodiment of the present invention is a method for forming a plurality of features on a first surface of a substrate that includes a first conductor, wherein the plurality of features is arranged in a first arrangement, the deposition system comprising: generating a first plurality of vapor molecule of a first organic material such that each vapor molecule of the first plurality thereof has a negative charge, wherein each vapor molecule of the first plurality thereof is generated such that it has a propagation direction that forms a propagation angle relative to a first axis that is normal to the first surface; passing the first plurality of vapor molecules through a first plurality of electrostatic lenses that are operative for reducing the propagation angle of at least one vapor molecule of the first plurality thereof; and passing the first plurality of vapor molecules through a shadow mask comprising a plurality of apertures that are arranged in the first arrangement.

DETAILED DESCRIPTION

Figure 1A:
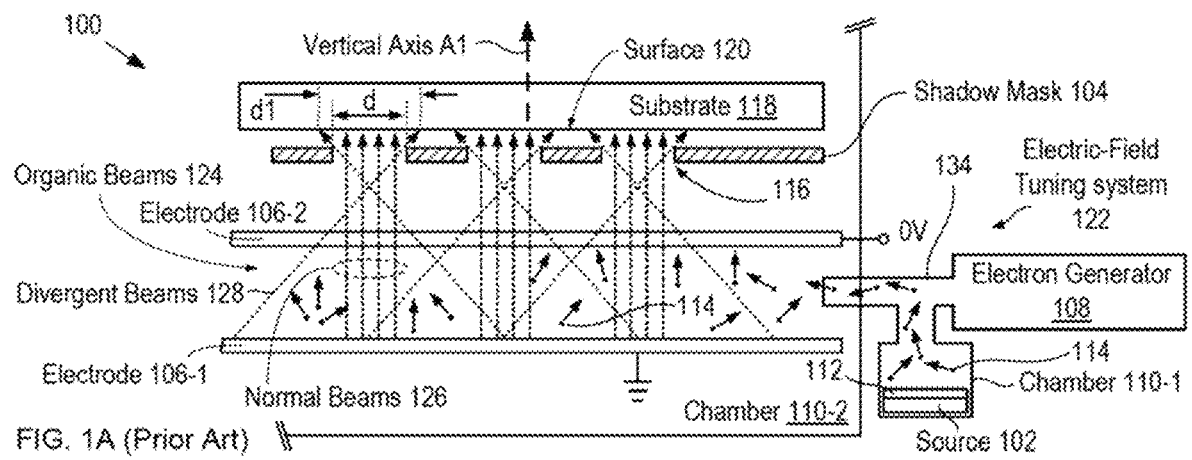
FIGS. 1A-B depict schematic drawings of a portion of a direct-deposition system having electric-field tuning capability in accordance with the prior art, with the electric-field tuning system in its disengaged and engaged states, respectively.
Figure 1B:
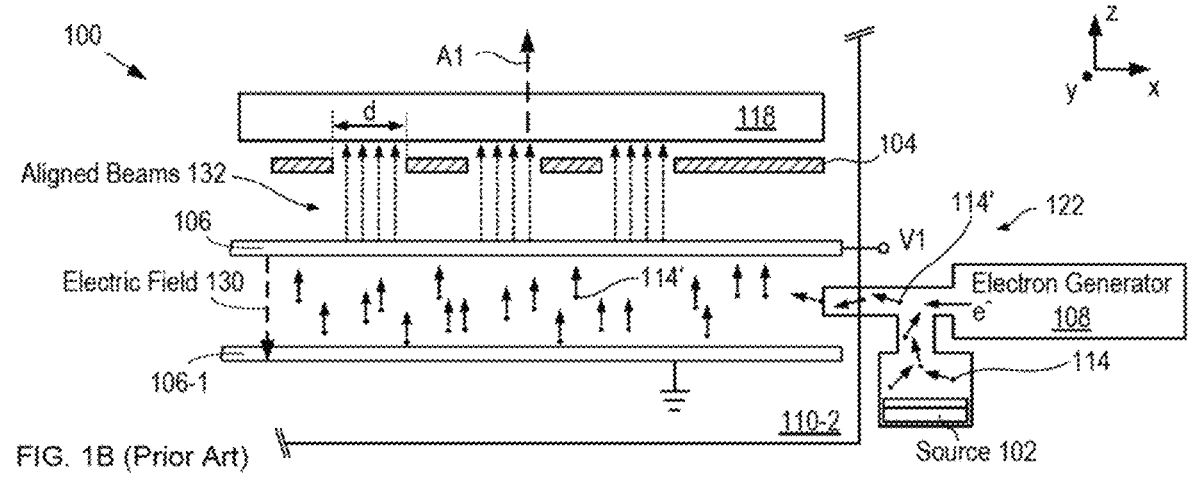

FIGS. 1A-B depict schematic drawings of a portion of a direct-deposition system having electric-field tuning capability in accordance with the prior art, with the electric-field tuning system in its disengaged and engaged states, respectively. System 100 includes source 102, shadow mask 104, electrodes 106-1 and 106-2, electron generator 108, and vacuum chambers 110-1 and 110-2. System 100 is a vertical evaporation system having vertical axis A1. System 100 is analogous to direct-deposition systems disclosed in U.S. Pat. No. 9,273,390, which is included herein by reference.

Source 102 is a conventional evaporation source located in vacuum chamber 110-1. Source 102 is operatively coupled with organic material 112 such that, when the organic material melted or sublimed within the low-pressure atmosphere of vacuum chamber 110-1, it evaporates to produce neutrally charged organic vapor molecules 114.

Shadow mask 104 is a plate of structural material that includes a plurality of apertures 116 whose size and arrangement are based on the desired deposition pattern for material 112. Shadow mask 104 is held in front of surface 120 of substrate 118 (typically a glass or semiconductor substrate) such that apertures 116 are aligned with the sites at which features of material 112 are desired. In the depicted example, each aperture 116 has lateral dimension d, which is equal to the desired lateral dimension of each intended patterned feature.

Electrode 106 is an electrically conductive plate comprising a plurality of through-holes (not shown for clarity), which allows vapor molecules to substantially freely pass from source 102 to shadow mask 104.

Electron generator 108 is an electron gun that, when engaged, emits a uniform flow of electrons into conduit 132, where the electrons can attach to neutrally charged vapor molecules 114 to produce charged vapor molecules 114'.

Electron generator 108, electrode 106, and source 102 collectively define electric-field tuning system 122.

Each of vacuum chambers 110-1 and 110-2 is a conventional pressure vessel operative for providing a low-pressure atmosphere.

Vacuum chamber 110-1 encloses source 102 and material 112, and is fluidically coupled with electron generator 108 and chamber 110-1 via conduit 134.

Vacuum chamber 110-2 encloses shadow mask 104, electrodes 106-1 and 106-2, and substrate 118. It also includes a gas feed-through that is fluidically coupled with conduit 132 to allow charged vapor molecules 114' to pass into the region between electrode 106-1 and electrode 106-2.

FIG. 1A depicts system 100 with electron generator 108 is turned off and a voltage of 0V applied to electrode 106 so no electric field is generated between it and source 102 (which is held at ground). In other words, the system is depicted with electric-field tuning system 122 disengaged. In this state, the vaporized atoms collectively travel toward shadow mask 104 along propagation directions referred to herein as organic beams 124, which include two broad classes of beams, normal beams 126 and divergent beams 128.

Normal beams 126 are aligned, or nearly aligned, with vertical axis A1 and their vapor molecules pass virtually straight through the shadow mask to deposit on surface 120 only within the lateral extent, d, of apertures 116.

Divergent beams 128 are not aligned with vertical axis A1, however. As a result, their motion has a significant lateral component after they pass through apertures 120. Divergent beams 128, therefore, deposit molecules of material 112 on surface 120 well beyond the lateral extent of their respective apertures.

Without engaging electric-field tuning system 122, therefore, organic beams 124 generate features on surface 120 whose lateral extents are d1, which is significantly larger than d. In other words, with electric-field tuning system 122 disengaged, no reduction of feathering, as compared to other typical prior-art direct deposition systems, is achieved by system 100.

With electric-field tuning system 122 engaged, as depicted in FIG. 1B, voltage V1 is applied to electrode 106 to generate electric field 130 between electrodes 106-1 and 106-2, where the electric field is substantially aligned with vertical axis A1. In addition, electron generator 108 is activated and emits a stream of electrons into conduit 132, where neutral vapor molecules 114 acquire these electrons and become charged molecules 114'. Charged molecules 114' then enter chamber 110-2 to populate the region between the electrodes.

Under the action of electric field 130, charged molecules 114' gain a directional motion that is more uniformly aligned with vertical axis A1. As a result, organic beams become more aligned with the vertical axis and become aligned beams 132. Aligned beams 132, therefore, have a reduced lateral component after they pass through apertures 120. Thus, they produce patterned features on surface 120 whose lateral extents are nearly equal to d (i.e., the desired lateral extent). In other words, with electric-field tuning system 122 engaged, a significant reduction of feathering, as compared to other typical prior-art direct deposition systems, is achieved by system 100.

Unfortunately, system 100 suffers from at least two drawbacks. First, the bombardment of neutral vapor molecules 114 with electrons can lead to dissociation of their organic molecules. Second, the need to provide a separate electron generator adds significant cost and complexity to the system.

It is an aspect of the present disclosure, however, that vapor molecules can be charged or polarized without the need for an electron generator or bombarding the vapor molecules with high-energy electron beams. Embodiments in accordance with the present disclosure exploit the fact that an evaporation source can be configured to enable injection of electrons from the source into the organic material while it is being evaporated to realize organic beams comprising vapor molecules that have a negative charge. Systems in accordance with the present disclosure also include one or more electrically biased plates located in the path of the charged molecules, where the electrically biased plates define arrangements of electrostatic lenses that substantially align the organic beams with the vertical axis of the system such that they are normally incident (or nearly normally incident) on the substrate surface.

Figure 2:
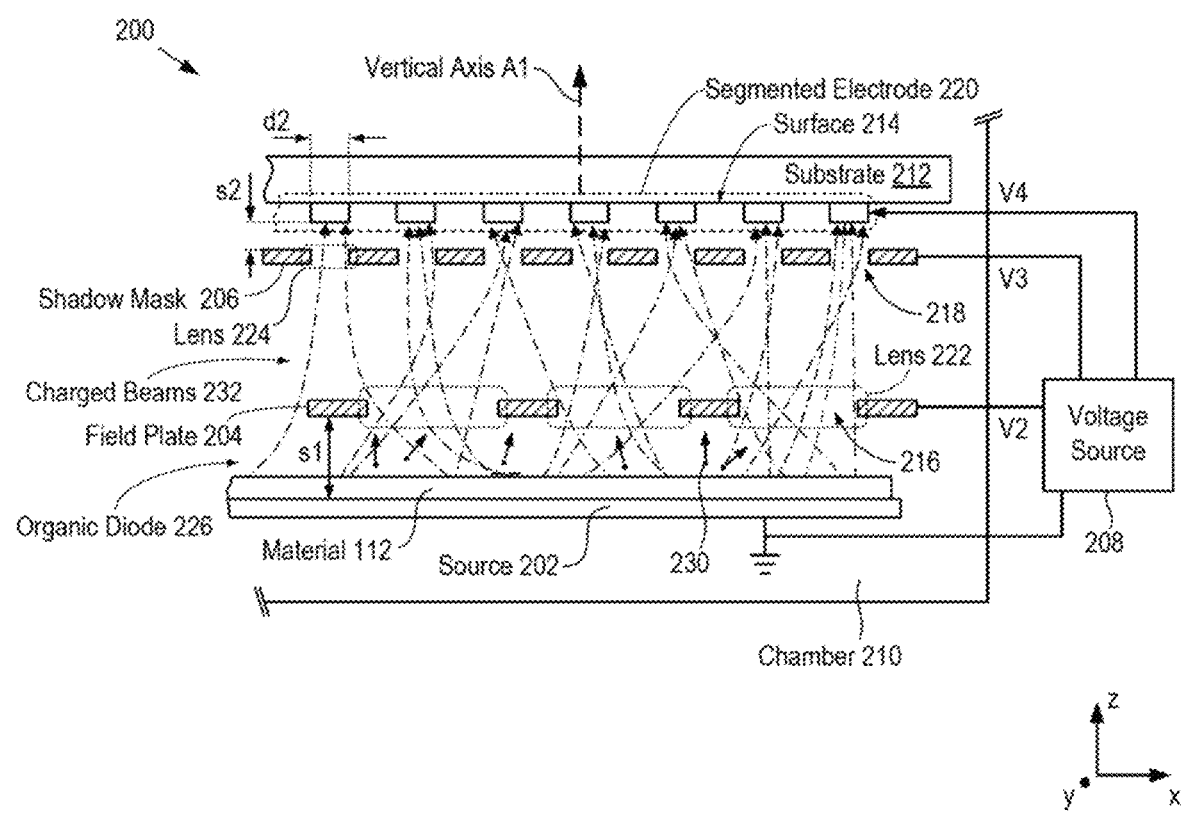
FIG. 2 depicts a schematic drawing of an illustrative embodiment of a direct-deposition system in accordance with the present disclosure.

FIG. 2 depicts a schematic drawing of an illustrative embodiment of a direct-deposition system in accordance with the present disclosure. System 200 includes source 202, field plate 204, shadow mask 206, voltage source 208, and vacuum chamber 210. System 200 is a vertical deposition system for directly patterning an organic material layer on surface 214 of substrate 212 with high fidelity with respect to the aperture pattern of a shadow mask.

Source 202 is a two-dimensional planar source comprising a planar metal sheet that functions as a heater that is operative for evaporating material 112. Material 112 is distributed in layer form across the top surface of the heater element such that the metal heater is in complete contact with the layer of material 112. When heated, material 112 vaporizes substantially uniformly across the surface of source 202. Exemplary planar evaporation sources suitable for use in embodiments in accordance with the present disclosure are disclosed by Tung, et al., in "OLED Fabrication by Using a Novel Planar Evaporation Technique," *Int. J. of Photoenergy*, Vol. 2014(18), pp. 1-8 (2014), which is incorporated herein by reference.

In the depicted example, source 202 is electrically connected to ground potential via conventional voltage source 208. In some embodiments, source 202 is electrically biased at a voltage potential other than ground.

While the illustrative embodiment includes a planar source, it will be clear to one skilled in the art, after reading this Specification, how to specify, make, and use alternative embodiments that include a different evaporation source, such as a single crucible, a source having a linear arrangement or two-dimensional arrangement of evaporation nozzles, and the like.

Field plate 204 is an electrically conductive plate (typically comprising a metal, such as stainless steel) that includes holes 216. Field plate 204 is electrically connected to voltage source 208.

In the depicted example, holes 216 occupy a large fraction of the two-dimensional area of field plate 204 such that field plate 204 has a porosity of less than 20%; however, other porosities can be used without departing from the scope of the present disclosure. As discussed below, the porosity of field plate 204 is selected such that holes 216 enable substantially unimpeded transit of negatively charged organic beams from 112 to shadow mask 206 while being small enough to function as electrostatic lenses for substantially aligning the organic beams with vertical axis A1.

Field plate 204 is located in system 200 such that it is substantially parallel with source 202 with a separation distance between them of s1. In the depicted example, s1 is approximately 5 mm; however, other values of s1 can be used without departing from the scope of the present disclosure. In accordance with the present disclosure, the value of s1 is chosen as any value that enables field plate 204 to electrically couple with source 202 to form electrostatic lenses 222, as discussed below. Typically, s1 is within the range from approximately 1 mm to approximately 10 cm.

When field plate 204 is biased with a suitable voltage, the field plate, source 202, and organic material 112 collectively define organic diode 226, which affords embodiments in accordance with the present disclosure significant advantage over prior-art direct-deposition systems. Specifically, the organic-diode functionality enables the metal heater included in source 202 to inject electrons into organic material 112 during its evaporation such that the vapor molecules generated during evaporation carry a negative charge. This avoids the dissociation of organic molecules that can result from bombardment of neutral vapor molecules (as is done in system 100), as well as the significant added expense and complexity associated with an external evaporation chamber and charge generator.

Because the mechanism taking place in organic diode 226 is quite complex, a discussion of the basic operating principle of an organic diode is provided here.

Organic Diode Operating Principle

Since the planar metal sheet of source 202 is in complete contact with the donor organic layer (i.e., material 112), electron injection from the metal to the organic layer occurs. The injection is based on the work function of the material of the planar metal sheet which functions as the cathode of organic diode 226. It should be noted that, since the planar metal sheet is heated, its material must be stable up to a temperature of approximately 500° C.

Heating of the metal sheet heater of source 202 reduces the work function of its metal, which promotes electron injection into material 112. By virtue of heating it to a suitable temperature, the organic layer will continuously evaporate and the vaporized molecules will carry the charge injected by the cathode. If the molecules are electro-negative in nature it is easy to charge the molecules negatively by electron injection by the cathode (the planar metal sheet heater of source 202).

As discussed below, by virtue of their thermal energy, the charged vapor molecules travel upward and pass through openings 216 of field plate 204.

The motion of the charged vapor molecules is more highly directed in embodiments disclosed herein due to application of an electric field between the target substrate (i.e., substrate 112) and source 202. The charged vapor molecules are polarized since they are subjected to this electric field. As a result, they have an intrinsic dipole moment and rotate themselves initially to align themselves parallel to the field. When the negatively charged vapor molecules reach the vicinity of a surface at positive electric potential (e.g., segmented electrode 220) their motion becomes directed toward that surface such that they are normally incident on it (i.e., their propagation direction is substantially normal to the surface).

Figure 3A:
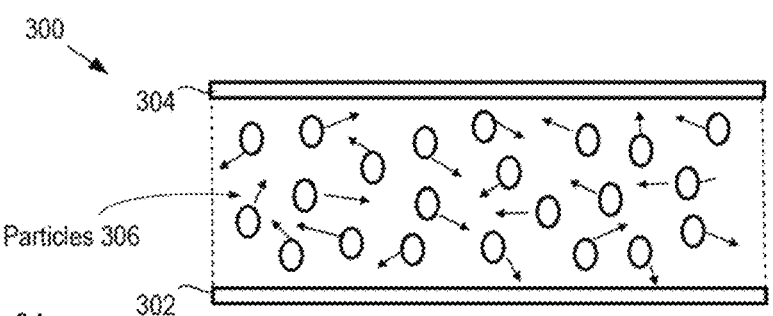
FIGS. 3A-B depict an organic diode configuration with and without applied bias voltage, respectively.
Figure 3B:
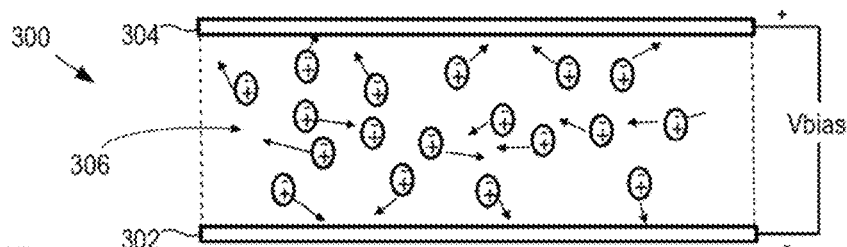

FIGS. 3A-B depict the motion of polarizable vapor molecules with and without an applied electric field, respectively. Arrangement 300 includes electrodes 302 and 304 and organic vapor molecules 306, which reside in a vacuum environment located between the electrodes.

As shown in FIG. 3A, when no voltage is applied between electrodes 302 and 304, vapor molecules 306 move randomly in all directions (as indicated by the arrows) due to their thermal energy.

When D.C. voltage, Vbias, is applied between the electrodes, however, vapor molecules 306 become polarized. As a result, those vapor molecules that are close to the electrode 304 move toward electrode 304, while those vapor molecules that are close to electrode 302 move towards electrode 302. It should be noted that the polarized vapor molecules that are substantially centrally located between the electrodes continue to move in random directions.

Embodiments in accordance with the present disclosure derive additional advantages over the prior art because, during evaporation of organic material 112, the work function of the metal structure of source 202 is reduced, which promotes electron injection into the organic material. The evaporated molecules of organic beams 226 (i.e., charged vapor molecules 230), therefore, carry the negative charge injected by the source.

Figure 3C:
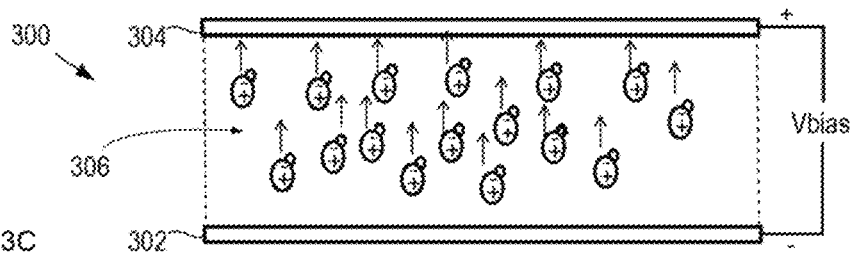
FIG. 3C depicts the operation of organic diode 300 when organic vapor molecules 306 carry negative charge due to attachment of an electron during their vaporization.

FIG. 3C depicts the highly directed motion of charged vapor molecules in the presence of an applied electric field. It should be noted that directionality of the motion of vapor molecules 306 toward positive electrode 304 is stronger when the vapor molecules are attached with electrons.

Returning now to the illustrative embodiment, shadow mask 206 is analogous to shadow mask 104; however, shadow mask 206 is electrically conductive and is electrically connected to voltage source 208. Shadow mask 206 is positioned in system 200 such that it is substantially parallel with surface 214 of substrate 212. In the depicted example, shadow mask 206 is a metal plate comprising apertures 218, which are analogous to apertures 116 described above. Apertures 218 have lateral dimension d2, and an aperture spacing that gives rise to a porosity of approximately 40% for shadow mask 206. In some embodiments, the porosity of shadow mask 206 is other than 40%; however, it is preferable that the porosity of shadow mask 206 is higher than the porosity of field plate 204. In some embodiments, shadow mask 206 is formed of a structural material that is not electrically conductive. In such embodiments, an electrically conductive layer is disposed on at least one of its top and bottom surfaces and electrically connected to voltage source 208.

Voltage source 208 is a conventional voltage source that is operative for providing bias voltages to source 202, field plate 204, shadow mask 206, and segmented electrode 220 of substrate 212.

Substrate 212 is a single-crystal silicon wafer that includes CMOS circuitry for operation as a high-resolution full-color OLED display, such as pixel drivers, row drivers, column drivers, timing circuits, image processors and power supplies, etc. At each sub-pixel location on substrate 212, an electronic via of the CMOS circuitry terminates at surface 214 as a metal stack suitable for functioning as the anode of an OLED sub-pixel element. A full-color OLED display includes an array of pixels, each of which comprises individually addressable sub-pixels that emit green, red, and blue light. In the depicted example, when depositing OLED material for one of these colors, the anodes for that color across all pixels of the display are electrically coupled to collectively define segmented electrode 220 on surface 214. Substrate 212 is located in system 200 such that segmented electrode 220 and shadow mask 206 are separated by distance s2. In the depicted example, s2 is equal to approximately 1 micron; however, other values of s2 can be used without departing from the scope of the present disclosure. In accordance with the present disclosure, the value of s2 is chosen, in part, to enable shadow mask 206 to electrically couple with segmented electrode 220 to form a plurality of electrostatic lenses 224. Typically, s2 is within the range of 1 approximately micron to approximately 100 microns.

It should be noted that segmented electrode 220 is depicted as projecting significantly from surface 214. In practice, the thickness of these structures can be neglected and the segmented electrode can be considered to be coplanar with surface 214.

In some embodiments, substrate 212 is a different substrate that includes electronic circuitry. In some embodiments, substrate 212 does not include electronic circuitry. In some embodiments, segmented electrode comprises conductive fields that comprise transparent conductive elements.

Figure 4:
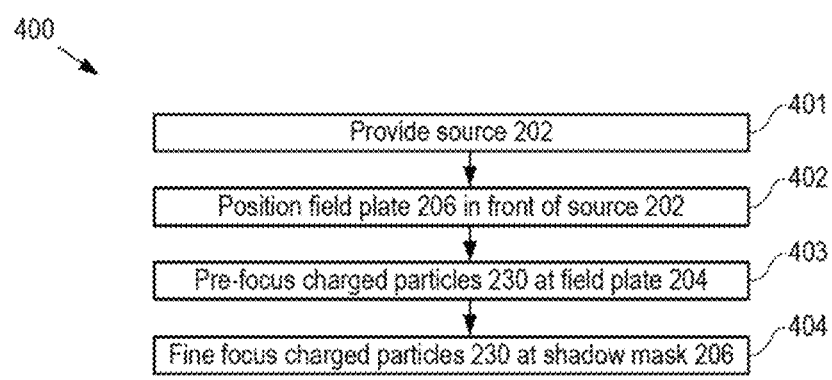
FIG. 4 depicts operations of a method for directly depositing a pattern of organic-material features with high fidelity in accordance with the illustrative embodiment.

FIG. 4 depicts operations of a method for directly depositing a pattern of organic-material features with high fidelity in accordance with the illustrative embodiment. Method 400 begins with operation 401, wherein voltage source 208 provides bias voltages, V2, V3, and V4 to field plate 204, shadow mask 206, and segmented electrode 220, respectively. The bias voltages are applied to their respective electrodes such that V4>V3>V2>0, thereby giving rise to an electric field between segmented electrode 220 and source 202. In the depicted example, V4 is equal to 300 V, V3 is equal to 150 V, and V2 is equal to 40 V; however, other voltages can be used for one or more of V4, V3, and V2 without departing from the scope of the present disclosure. Typically, V4 is within the range of approximately 100 V to approximately 400 V; V3 is within the range of approximately 50 V to approximately 200 V; and V2 is within the range of approximately 10 V to approximately 50 V.

It should be noted that the values of voltages V4, V3, and V2 and the values of s1 and s2 are inter-related and selected to realize deposition of features having little or no feathering.

At operation 402, source 202 evaporates organic material 112 to give rise to charged vapor molecules 230. Charged vapor molecules 230 collectively define charged beams 232.

By virtue of their thermal energy, charged vapor molecules 230 travel upward and pass through openings 216 in field plate 204. Due to the electric field between the segmented electrode and the source, charged vapor molecules 230 become polarized. As a result, each polar vapor molecule has an intrinsic dipole moment and rotates itself initially such that it is parallel to the field.

At operation 403, charged vapor molecules 230 are pre-focused at field plate 204. When negatively charged polar molecules are in the vicinity of a surface at positive electric potential, the charged polar molecules will tend to have a directed motion towards that surface. As a result, the electric field lines between source 202 and openings 216 collectively define a plurality of electrostatic lenses 222, each of which gives rise to focusing of charged vapor molecules 230. As a result, those charged beams 232 that are not directed along vertical axis A1 (referred to as off-axis charged beams) are curved toward surface 214 as they pass toward and through electrostatic lenses 222.

At operation 404, the focus of charged vapor molecules 230 is further refined at shadow mask 206. The electric field lines between segmented electrode 220 and apertures 218 collectively define electrostatic lenses 224, each of which gives rise to further focusing of charged vapor molecules 230 as they approach shadow mask 206. As a result, the directionality of charged beams 232 is further refined toward vertical axis A1 such that they are substantially normal to surface 214 as they pass through the apertures of the shadow mask.

Figure 5:
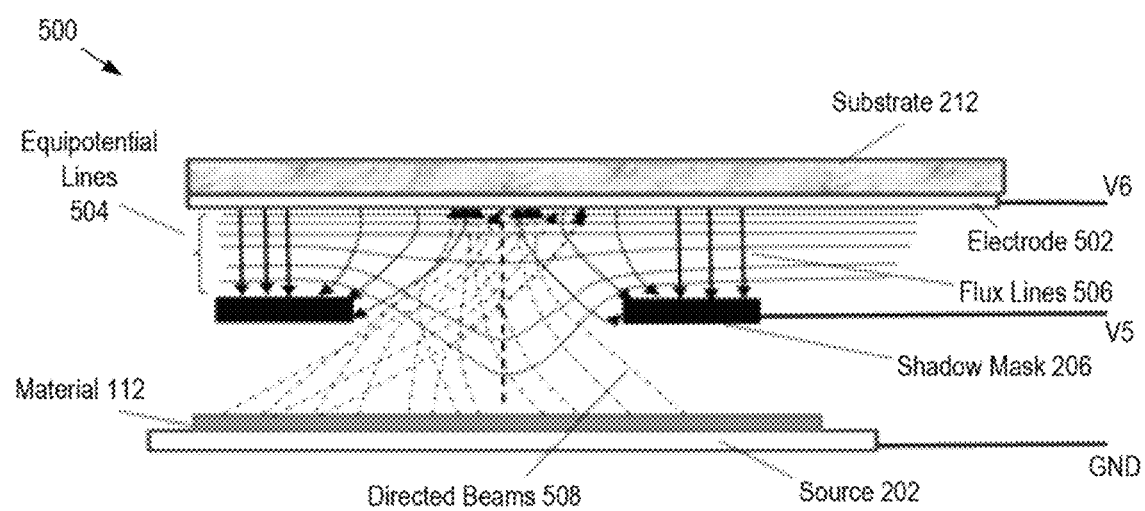
FIG. 5 depicts a schematic drawing of a cross-sectional view of an electrostatic lens in accordance with the present disclosure.

FIG. 5 depicts a schematic drawing of a cross-sectional view of an electrostatic lens in accordance with the present disclosure. Electrostatic lens 500 is analogous to electrostatic lens 224; however, electrostatic lens 500 includes source 202, electrode 502, and shadow mask 206. It should be noted that the operation of electrostatic lens 500 is equivalent to that of system 200 without the inclusion of field plate 204.

Electrode 502 is analogous to segmented electrode 220; however, electrode 502 is a continuous sheet of electrically conductive material disposed on substrate 212.

Voltages V5 and V6 (where V6>V5) are applied to shadow mask 206 and electrode 502, respectively, while source 202 is held at ground potential.

When organic material 112 is evaporated by heating source 202, the charged vapor molecules give rise to organic beams, as discussed above.

Equipotential lines 504 and flux lines 506 in the region of aperture 218 collectively define an electro-static lens that focuses the charge-carrying organic vapor molecules. The paths of the organic vapors are curved to form directed beams 508 such that the conductive vapor molecules of the directed beams are substantially normally incident on conductor 502.

Returning now to the illustrative embodiment depicted in FIG. 2, by virtue of the focusing action of electrostatic lenses 222 and 224, lateral motion of charged vapor molecules 230 after they pass through apertures 218 is significant reduced or eliminated. The feathering that would have occurred without it is, therefore, substantially avoided and patterned features having the desired lateral extent of d2 on surface 214 are realized.

In some embodiments in accordance with the present disclosure, additional stages of beam curvature are included by adding one or more additional field plates between field plate 204 and shadow mask 206.

In some embodiments, beam curvature is achieved only at shadow mask 206 and no field plate is included between source 202 and the shadow mask.

Figure 6:
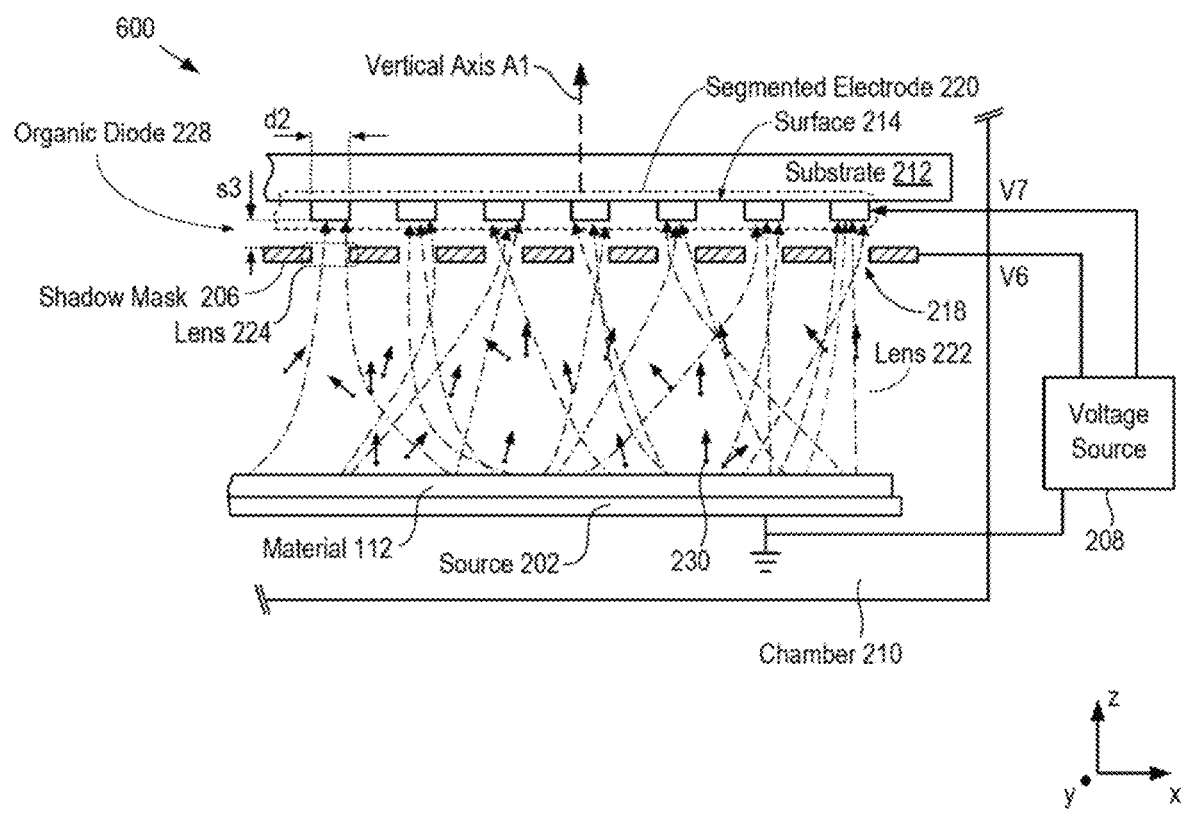
FIG. 6 depicts a schematic drawing of an alternative embodiment of a direct-deposition system in accordance with the present disclosure.

FIG. 6 depicts a schematic drawing of an alternative embodiment of a direct-deposition system in accordance with the present disclosure. System 600 is analogous to system 200; however, system 600 does not include field plate 204. As a result, system 600 includes only one set of electrostatic lenses—namely, electrostatic lenses 224. Therefore, only one stage of beam curvature is affected in system 600.

It is to be understood that the disclosure teaches just some embodiments in accordance with the present disclosure and that many variations can easily be devised by those skilled in the art after reading this disclosure and that the scope of the invention is determined by the following claims.

What is claimed is:

1. A method for forming a plurality of features on a first surface of a substrate that includes a first conductor, wherein the plurality of features is arranged in a first arrangement, the deposition system comprising:
    generating a first plurality of vapor molecules of a first organic material such that each vapor molecule of the first plurality thereof has a negative charge, wherein each vapor molecule of the first plurality thereof is generated such that it has a propagation direction that forms a propagation angle relative to a first axis that is normal to the first surface;
    passing the first plurality of vapor molecules through a first plurality of electrostatic lenses that are operative for reducing the propagation angle of at least one vapor molecule of the first plurality thereof; and
    passing the first plurality of vapor molecules through a shadow mask comprising a plurality of apertures that are arranged in the first arrangement;
    providing a first voltage potential between a voltage source and the first conductor; and
    providing a second voltage potential between the voltage source and the shadow mask, wherein the second voltage potential is less than the first voltage potential;
    locating a field plate that includes a plurality of holes between the voltage source and the shadow mask in a second arrangement, wherein the field plate is electrically conductive; and
    providing a third voltage potential between the voltage source and the field plate, wherein the third voltage potential is lower than the second voltage potential.

2. The method of claim 1 wherein each electrostatic lens of the first plurality thereof is located at a different aperture of the plurality thereof.

3. The method of claim 1 further comprising passing the first plurality of vapor molecules through a second plurality of electrostatic lenses that are operative for further reducing the propagation angle of the at least one vapor molecule of the first plurality thereof.

4. The method of claim 3 wherein each of the first plurality of electrostatic lenses is located at a different hole of the plurality thereof, and further wherein each of the second plurality of electrostatic lenses is located at a different aperture of the plurality thereof.

5. The method of claim 3 wherein the propagation angle of the at least one vapor molecule is substantially equal to zero after passing through the second plurality of electrostatic lenses.

* * * * *